United States Patent [19]

Boyd

[11] Patent Number: 4,912,537
[45] Date of Patent: Mar. 27, 1990

[54] IMAGE SENSING ARRAY WITH CHARGE ISOLATION

[75] Inventor: Stuart D. J. Boyd, Watertown, Mass.

[73] Assignee: Polaroid Corporation, Cambridge, Mass.

[21] Appl. No.: 211,468

[22] Filed: Jun. 24, 1988

[51] Int. Cl.⁴ .............................................. H01L 27/14
[52] U.S. Cl. ...................................... 357/30; 357/24; 357/59; 357/39; 357/23.7; 250/578.1; 358/213.12; 358/213.19
[58] Field of Search .................... 357/59, 23.7, 30, 32, 357/24 LR; 250/578; 358/213.12, 213.19

[56] References Cited

U.S. PATENT DOCUMENTS

| | | | |
|---|---|---|---|
| 4,236,829 | 12/1980 | Chikamura et al. | 357/16 |
| 4,271,420 | 6/1981 | Chikamura et al. | 357/30 |
| 4,388,532 | 6/1983 | Garcia | 250/578 |
| 4,500,924 | 2/1985 | Ohta | 358/213 |
| 4,599,637 | 7/1986 | Kon | 357/30 |
| 4,620,232 | 10/1986 | Tisue | 358/213 |
| 4,626,916 | 12/1986 | Mizoguchi et al. | 358/213 |
| 4,654,678 | 3/1987 | Lightstone et al. | 357/13 |
| 4,663,771 | 5/1987 | Takeshita et al. | 377/58 |
| 4,688,098 | 8/1987 | Kon et al. | 357/30 |
| 4,717,945 | 1/1988 | Yusa et al. | 357/24 |
| 4,819,074 | 4/1989 | Suzuki | 250/578 |

Primary Examiner—Andrew J. James
Assistant Examiner—Jerome Jackson, Jr.
Attorney, Agent, or Firm—Edward S. Roman

[57] ABSTRACT

A semiconductor image sensing array for an electronic still image camera comprising a plurality of light sensing elements may be electronically shuttered by a gate control electrode in each light sensing element which operates simultaneously to inhibit the further transfer of signal charges to the substrate while isolating the signal charges transferred to the substrate during the previous scene light integration.

12 Claims, 4 Drawing Sheets 4,912,537

IMAGE SENSING ARRAY WITH CHARGE ISOLATION

BACKGROUND OF THE INVENTION

1. Field of the Invention

This invention relates generally to an image sensor with electronic shuttering and, more particularly, to a semiconductor image sensor in which signal charge may be selectively isolated to provide electronic shuttering.

2. Description of the Prior Art

Electronic still image cameras embodying solid state image sensing arrays are now well known in the art. Such cameras are operated in a manner similar to conventional cameras in that the camera user first frames and composes a scene to be recorded and then actuates a button on the camera to commence an exposure time interval during which scene light is integrated by an image sensing array. The commencement and termination of such exposure intervals are generally controlled by conventional mechanical shutter mechanisms that initially move out of a scene light blocking position with respect to the image sensing array to commence the exposure interval and after a select exposure time period move back into the scene light blocking position with respect to the image sensing array to terminate the exposure interval. Such mechanical shutter mechanisms add undue cost and complexity to electronic imaging cameras. It is, therefore, desirable to do away with such mechanical shutters by electronically shuttering the image sensing array so as to electronically control the time duration which image scene light is integrated. Although image sensing arrays may be electronically actuated and deactuated to control, respectively, the initiation and termination of charge integration, charge leakage during the off period generally degrades the image previously captured during the exposure interval.

Therefore, it is a primary object of this invention to provide a solid state image sensor for an electronic still image camera that may be used without a mechanical shutter.

It is a further object of this invention to provide a solid state image sensor that may be electronically shuttered by effectively isolating the signal charges integrated by each light sensing element of the array.

Other objects of the invention will be, in part, obvious and will, in part, appear hereinafter. The invention accordingly comprises a mechanism and system possessing the construction, combination of elements, and arrangement of parts which are exemplified in the following detailed disclosure.

DESCRIPTION OF THE DRAWINGS

The novel features that are considered characteristic of the invention are set forth with particularity in the appended claims. The invention itself, however, both as to its organization and its method of operation, together with other objects and advantages thereof will be best understood from the following description of the illustrated embodiment when read in connection with the accompanying drawings wherein:

SUMMARY OF THE INVENTION

Figure 1:
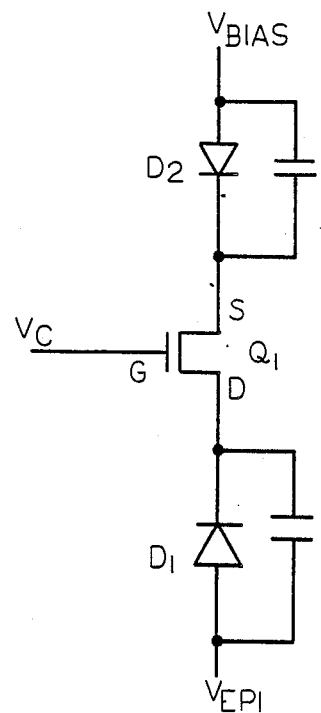
FIG. 1 is a schematic circuit diagram of one light sensing element of this invention.

A solid state image sensing array is provided on a semiconductor substrate of a first select conductivity type and comprises a plurality of light sensing elements disposed about the substrate in rows and columns. Each of the light sensing elements comprises a first select region of ion implantation in the substrate and a second select region of a second select conductivity type opposite to the first select conductivity type spaced apart from the first region. The second region is cooperatively associated with the substrate so as to define a first diode. Means are provided for receiving light and converting the photons of the received light to signal charges. Semiconductor gating means are provided in operative association with the substrate and the converting means for controlling the conduction of the signal charges from the converting means to the first diode. The gating means comprises a gate control electrode extending over the first ion implanted region of the substrate such that upon energization of the gate control electrode to a first select potential, the gating means operates to conduct charges from the converting means to the first diode while the gate control electrode simultaneously operates to establish a first potential well region in the first ion implanted region under the gate control electrode and extending to the second region. The first potential well is deepest in the region immediately underlying the gate control electrode so as to cause signal charges from the first diode to enter the deepest portion of the first potential well region. Upon energization of the gate control electrode to a second select potential below the first select potential, the gating means operates to discontinue the conduction of charges from the converting means to the first diode and the gate control electrode operates to establish a second potential well region in the first ion implanted region of less depth than the first potential well region so as to isolate the signal charges held therein. A plurality of conductive column straps each connected to a select number of gate control electrodes are selectively energizable to energize the connecting gate control electrodes. A plurality of conductive row electrodes are each located, respectively, in spaced apart relation relative to a different one of the gate control electrodes. A plurality of conductive row straps each connect to a select number of the row electrodes and are selectively energizable to energize respective connecting row electrodes.

DESCRIPTION OF THE PREFERRED EMBODIMENTS

Referring now to FIGS. 2-5, there is shown the physical construction for a light sensing element having the charge isolation feature of this invention. Although one light sensing element is shown, it will be readily understood that in a preferred embodiment, a plurality of light sensing elements constructed in the foregoing manner are arranged in rows and columns to provide a two-dimensional image sensing array of either the charge-coupled device (CCD) type or the charge-injection device (CID) type.

The light sensing element 10 is formed on a semiconductor substrate 14 preferably comprising bulk silicon having a P type conductivity. The P type dopant may comprise boron or any other well-known P type dopant. An electrically active area as shown generally at 12 is formed on the semiconductor substrate 14 by any well-known procedure such as selective or local oxidation (LOCOS). The active area 12 defines the area of the light sensing element 10, and as will be well understood a plurality of such active areas are disposed in spaced apart relation in rows and columns in the semiconductor substrate 14. Each active area 12 is bound by thick oxide insulating regions as shown at 21 and 21' which are formed as part of the aforementioned selective or local oxidation (LOCOS) process so as to isolate the active area 12 from the active areas of adjacent light sensing elements (not shown). As will be readily understood, each thick oxide insulating region 21, 21' may have an underlying channel stop region to further facilitate isolation between adjacent light sensing elements.

Figure 2:
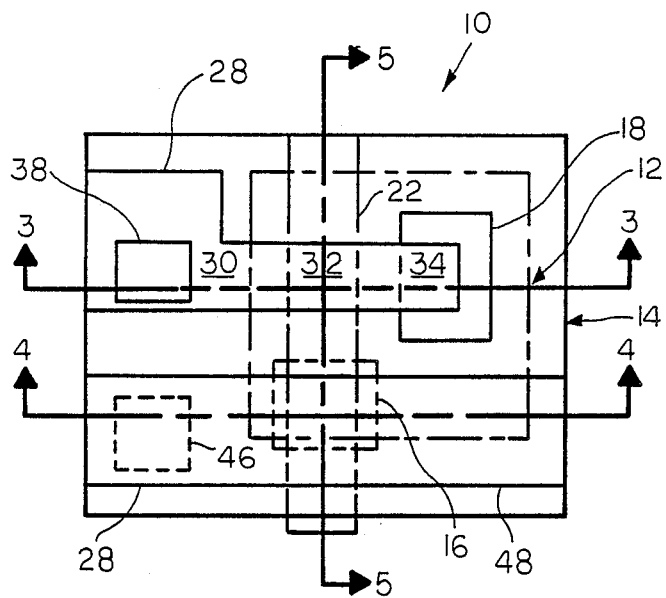
FIG. 2 is a top plan view of the semiconductor structure for one of the light sensing elements of this invention.
Figure 4:
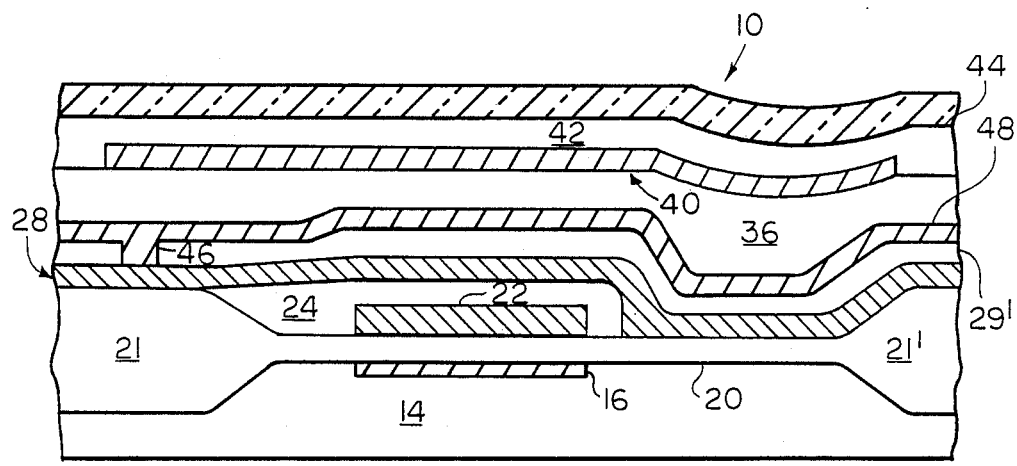
FIG. 4 is a cross-sectional view taken along the line 4—4 of FIG. 2.

A select region of the active area 12 as shown at 16 in FIGS. 2 and 4 is ion implanted with a suitable N type dopant such as phosphorous to raise the surface potential and thus increase the charge storage capacity of this region. The adjacent unimplanted region forms a barrier to charge transfer when appropriate voltages are appled in a manner as will become more apparent from the following discussion.

Spaced apart from the first ion implanted region 16 there is provided a second region 18 which is heavily doped with an N type dopant such as arsenic. The junction between the N conductivity type region 18 and the P conductivity type bulk silicon substrate 14 defines an N+ diode as shown at $D_1$ in FIG. 1. The N conductivity type region 18 may be formed by any conventional ion implantation or diffusion method utilizing standard photoresist masking techniques.

A lower insulating oxide layer 20 preferably comprising silicon dioxide is next deposited or grown in a conventional manner over the silicon substrate 14 and its associated ion implanted and/or diffused regions 16 and 18 in the active area 12. As is readily apparent from FIG. 3, the oxide insulating layer 20 is contiguous with the thick oxide insulating regions 21 and 21' outside the active area 12 so as to isolate the active area 12.

A first polysilicon layer 22 is deposited in overlying relationship with respect to the insulating oxide layer 20 and patterned to form a gate electrode. The polysilicon gate electrode 22 is preferably heavily N doped with a suitable N type dopant such as phosphorous.

Figure 3:
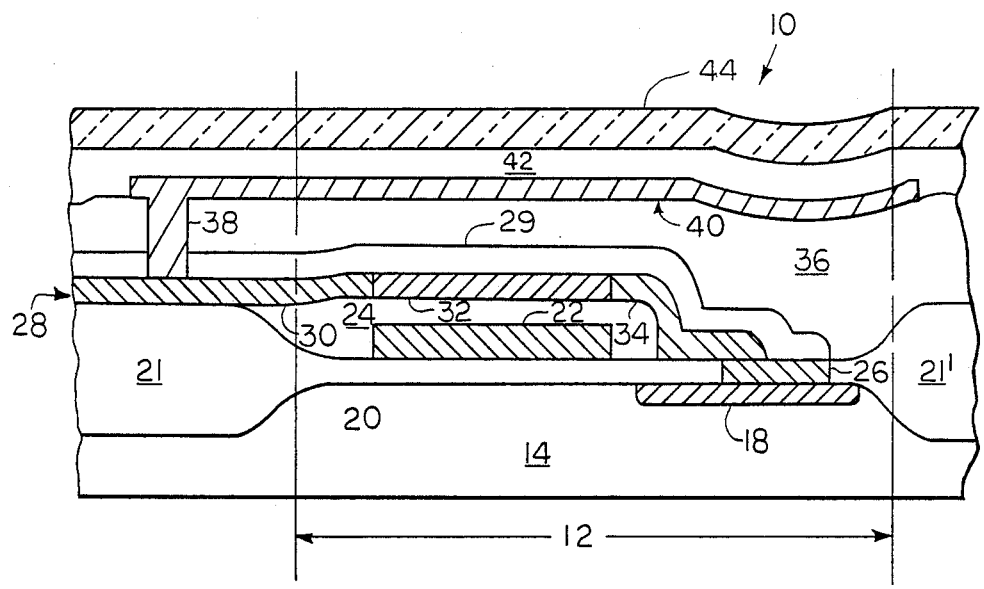
FIG. 3 is a cross-sectional view taken along the line 3—3 of FIG. 2.
Figure 5:
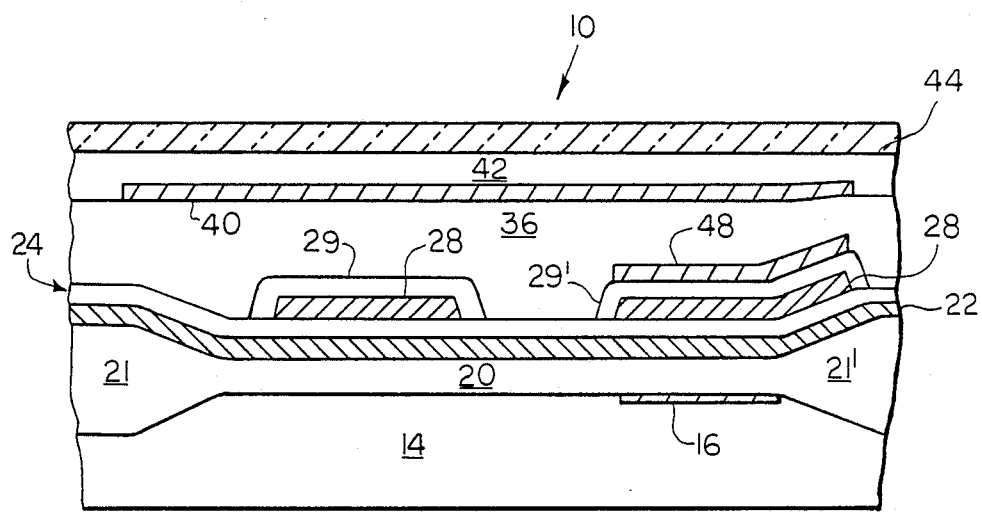
FIG. 5 is a cross-sectional view taken along the line 5—5 of FIG. 2.

A second insulating oxide layer 24 preferably of silicon dioxide is deposited as shown in FIGS. 3–5 in overlying relationship with respect to the first insulating oxide layer 20 and the gate electrode polysilicon layer 22. A window 26 is opened in the first insulating oxide layer 20 by any conventional pattern and etch technique so as to expose a portion of the surface of the N type doped region.

A second layer 28 of polysilicon is deposited in overlying relationship with respect to the first and second insulating oxide layers 20, 24 as shown in FIG. 3. The second polysilicon layer 28 also extends through the window 26 into contact with the N type doped region 18. The layer 28 is suitably etched by any well-known technique to form the patterns as best shown in FIGS. 2 and 5. Source, channel and drain regions shown, respectively, at 30, 32 and 34 are formed in the second polysilicon layer 28 by any conventional ion implantation and/or doping technique. As will be now readily understood, the source, channel and drain regions 30, 32 and 34 of the polysilicon layer 28 in cooperation with the polysilicon gate electrode 22 define a metal oxide field effect transistor (MOSFET) as shown schematically in FIG. 1 at $Q_1$. Insulating oxide layers preferably comprising silicon oxide as shown at 29 and 29' are deposited over the selectively patterned layer 28. A metallized row strap electrode 48 is deposited in overlying relation to the oxide layer 29' and connected to the polysilicon layer 28 by a connector 46 (FIG. 4). Both the row strap electrode 48 and connector 46 may comprise a suitable refractory metal such as tungsten.

An insulating oxide layer as shown at 36 preferably comprising silicon dioxide is formed in overlying relationship with respect to the insulating oxide layers 24, 29 and 29'. As will be readily understood, any suitable planarizing material may be used to form the insulating oxide layer 36. A window is next opened in the insulating layer 36 in a region immediately above the source region 30 of the silicon layer 28, and a suitable refractory metal such as tungsten is deposited as shown at 38 to provide a conductive connection to the source region 30.

A light blocking metallized layer as shown at 40 is deposited in overlying relationship with respect to the insulating layer 36 in electrical connection with the tungsten connector 38. The metallized layer 40 operates as a cathode electrode for a photodiode as shown schematically in FIG. 1 at $D_2$. The light blocking layer 40 may comprise a suitable metal such as aluminum or tungsten and is preferably maintained at a uniform potential to prevent the penetration of scene light to the source 30, channel 32 and drain 34 regions of the transistor $Q_1$. Alternatively, the cathode may comprise a polysilicon layer in conjunction with a light blocking metallized layer such as tungsten. An amorphous silicon layer as shown at 42 is deposited by any well-known technique in overlying relationship with respect to the metallized layer 40. Although amorphous silicon is preferred, any other suitable material may be used in its place. Finally, a transparent electrode as shown at 44 is deposited in overlying relationship with respect to the amorphous silicon 42. The transparent electrode 44 operates as the anode terminal for the photodiode $D_2$ as shown in FIG. 1.

The photoconductive amorphous silicon layer 42 in conjunction with the transparent electrode layer 44 provide the photocollection layer of the light sensing element and operate to capture impinging photons and convert them to electron hole charge pairs. The optical aperture of the light sensing element is determined by this photocollection area which can extend beyond the active area of the light sensing element 10 to provide high sensitivity at all wavelengths including blue.

Figure 6A:
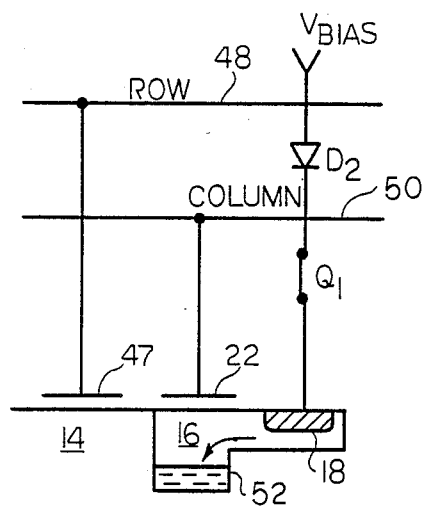
FIGS. 6A-6C are schematic diagrams showing one light sensing element of the invention in various stages of operation.

During scene light integration in the aforementioned manner a suitable potential is applied to the gate electrode 22 by way of a common column interconnect or conductive strap 50 (FIGS. 6A–6C) so as to switch the transistor $Q_1$ into conduction and thereby direct the photoconverted signal charges by way of the tungsten connector 38 through the source 30, channel 32 and drain 34 regions of the field effect transistor $Q_1$ to the N plus doped region 18. As will be readily understood, a suitable bias voltage ($V_{BIAS} - V_{EPI}$) is applied to the photodiode as shown in FIG. 1. The voltage level applied to the gate electrode 22 is sufficient to turn the transistor $Q_1$ on and also simultaneously establish a deep potential well region 52 in the ion implanted region 16 immediately underlying the gate electrode 22 as shown in FIG. 6A. The doping levels are adjusted so that the potential well 52 is deepest in a region spaced apart from the diode $D_1$ as defined by the junction interface between the silicon substrate 14 and the N type diffused region 16. Thus, signal charge is forced to fall into the deepest potential well as shown at 52 some distance away from the diode junction as defined by the junction interface between the silicon substrate 14 and the N type region 18.

Figure 6B:
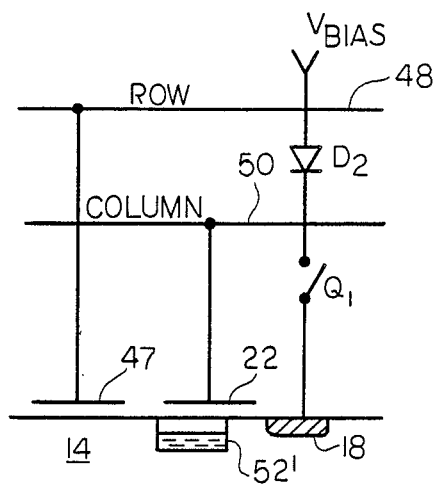
Figure 6C:
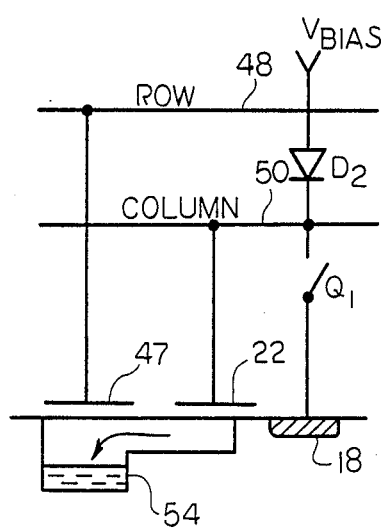

At the instant at which it is desired to terminate the exposure interval, the voltage potential at the gate electrode 22 is lowered to a second select level below the first select level sufficient to turn the field effect transistor $Q_1$ off as illustrated in FIG. 6B. At this instant, the surface potential in the silicon substrate 14 underlying the gate electrode 22 is reduced so that the well 52' still holds the received signal charge. Under the remainder of the gate electrode 22, however, outside the first region 16 of ion implantation, the potential is pinned at the surface thus isolating the signal charge in the ion implanted region as shown at 52'. In this manner electronic shuttering may be provided since any signal charge leakage by way of the diodes $D_1$ and $D_2$ and the field effect transistor $Q_1$ are positively prohibited from entering the well region 52' as shown in FIG. 6B.

Once the signal charge is isolated in the foregoing manner in the deepest part of the potential well 52' under the gate electrode 22, it can be read out either by using a conventional charge injection technique (CID) or a charge-coupled technique (CCD). For instance, a row electrode as shown at 47 adjacent the gate electrode 22 may be energized to provide the deep potential well as shown at 54 in FIG. 6c into which signal charges are forced to fall from their previous position underlying the gate electrode 22. Charges can then be transferred in the conventional manner of the CID structure by way of the row electrode 46 and the interconnecting row conductive strap 48. In like manner, the charges underlying the gate electrode and a potential well 52' may be transferred in a well-known manner by adjacent phase electrodes (not shown) in a CCD structure. Thus, as is now readily apparent, image sensing arrays comprising pluralities of light sensing elements structured in the aforementioned manner may provide for electronic shuttering upon application of the gate disabling voltage to the gate electrode 22 of each light sensing element so as to turn off the field effect transistor $Q_1$ and isolate the signal charges in the region of the silicon substrate 14 underlying the gate electrode.

The layers which make up the photodiode $D_2$ could alternatively be replaced with other materials to form an avalanche photodiode or photoconductor which would generate signal gain. It is possible that gains significantly greater than unity could be achieved with this structure thereby making possible an image sensor that could be operated at considerably lower noise levels that are not currently achievable. Also, the diode $D_1$ could alternatively be formed using the well-known buried polysilicon contact diode formation technique.

Other embodiments of the invention including additions, subtractions, deletions and other modifications of the preferred disclosed embodiments of the invention will be obvious to those skilled in the art and are within the scope of the following claims.

What is claimed is:

1. A solid state light sensing element comprising:
   a semiconductor substrate of a first select conductivity type having a first select region of ion implantation, and a second select region of a second select conductivity type opposite to said first select conductivity type spaced apart from said first region and cooperatively associated with said substrate in a manner defining a diode;
   means for receiving light and converting the photons of the received light to signal charges; and
   semiconductor gating means operatively associated with said substrate and said converting means for controlling the flow of signal charges from said converting means to said diode, said grating means comprising a gate control electrode extending over said first ion implanted region of said substrate such that upon energization of said gate electrode to a first select potential, said gating means operates to conduct signal charges from said converting means to said diode and said gate control electrode operates to establish a first potential well region in said first ion implanted region underlying said gate control electrode and extending to said second region, said first potential well being deepest in the region immediately underlying said gate control electrode so as to cause charges from said diode to enter said deepest portion of said first potential well region, and such that upon energization of said gate control electrode to a second select potential below said first potential wherein said gating means operates to discontinue the conduction of signal charges from said converting means to said diode and said gate control electrode operates to establish a second potential well region in said first ion implanted region of less depth than said first potential well region so as to isolate the signal charges held therein.

2. The light sensing element of claim 1 wherein said semiconductor gating means comprises a field effect transistor.

3. The light sensing element of claim 2 wherein said field effect transistor comprises a first layer of an oxide of silicon overlying a portion of said substrate, a second layer of polysilicon overlying said first layer and sufficiently doped to define said gate control electrode, a third layer of an oxide of silicon overlying said gate control electrode layer, a fourth layer of polysilicon overlying said third layer and said gate control electrode layer and connecting to said second region of said diode, said fourth layer of polysilicon, being suitably doped and/or ion implanted to define source, drain and channel regions for said field effect transistor.

4. The light sensing element of claim 3 wherein: said second region is diffused into said substrate, said substrate is doped to be a P type conductivity, said second region is doped to be an N type conductivity and the boundary between said substrate and said second region defines a PN junction.

5. The light sensing element of claim 3 wherein said converting means comprises a photodiode.

6. The light sensing element of claim 5 wherein said photodiode comprises a metallized cathode electrode layer in electrical connection with respect to the source electrode of said field effect transistor, an amorphous silicon layer overlying said cathode electrode and a transparent anode electrode overlying said amorphous silicon layer.

7. A solid state image sensing array comprising:
a semiconductor substrate of a first select conductivity type;
a plurality of light sensing elements disposed about said substrate in rows and columns each of said light sensing elements comprising a first select region of ion implantation in said substrate; a second select region of a second select conductivity type opposite to said first select conductivity type spaced apart from said first region and cooperatively associated with said substrate in a manner defining a diode; means for receiving light and converting the photons of the received light to signal charges; semiconductor gating means operatively associated with said substrate and said converting means for controlling the flow of signal charges from said converting means to said first diode, said gating means comprising a gate control electrode extending over said first ion implanted region of said substrate such that upon energization of said gate control electrode to a first select potential, said gating means operates to conduct signal charges from said converting means to said diode and said gate control electrode operates to establish a first potential well region in said first ion implanted region underlying said gate control electrode and extending to said second region, said first potential well being deepest in the region immediately underlying said gate control electrode so as to cause charges from said diode to enter said deepest portion of said first potential well region, and such that upon energization of said gate control electrode to a second select potential below said first select potential, said gating means operates to discontinue the conduction of charges from said converting means to said diode and said gate control electrode operates to establish a second potential well region in said first ion implanted region of less depth than said first potential well region so as to isolate the charges held therein;

a plurality of conductive column strips each connecting to a select number of said gate control electrodes, and each being selectively energizable to energize said connecting gate control electrodes;
a plurality of conductive row electrodes each located in spaced apart relation relative to a different one of said gate control electrodes; and
a plurality of conductive row straps each connecting to a select number of said row electrodes, and each being selectively energizable to energize said connecting row electrodes.

8. The image sensing array of claim 7 wherein each of said semiconductor gating means for each light sensing element comprises a field effect transistor.

9. The image sensing array of claim 8 wherein said field effect transistor of each light sensing element comprises a first layer of an oxide of silicon overlying a portion of said substrate, a second layer of polysilicon overlying said first layer and sufficiently doped to define said gate control electrodes, a third layer of an oxide of silicon overlying said gate control electrode layer, a fourth layer of polysilicon overlying said third layer and said gate control electrode layer and connecting to said second region of said diode, said fourth layer of polysilicon being suitably doped and/or ion implanted to define source, drain and channel regions for said field effect transistor.

10. The image sensing array of claim 9 wherein said second region of each light sensing element is diffused into said substrate, said substrate is doped to be a P type conductivity, said second region is doped to be an N type conductivity and the boundary between said substrate and said second region defines a PN junction.

11. The image sensing array of claim 9 wherein said converting means for each of said light sensing elements comprises a photodiode.

12. The image sensing array of claim 11 wherein each of said photodiodes comprises a metallized cathode electrode layer in electrical connection with respect to the source electrode of said field effect transistor, an amorphous silicon layer overlying said cathode electrode and a transparent anode electrode overlying said amorphous silicon layer.

* * * * *